(12) United States Patent
Chang et al.

(10) Patent No.: US 12,484,378 B1
(45) Date of Patent: Nov. 25, 2025

(54) DISPLAY HAVING SEMICONDUCTING OXIDE GATE DRIVER CIRCUITRY WITH ADJUSTABLE THRESHOLD VOLTAGE

(71) Applicant: Apple Inc., Cupertino, CA (US)

(72) Inventors: Pei-En Chang, San Jose, CA (US); Rungrot Kitsomboonloha, San Jose, CA (US); Akira Matsudaira, Santa Clara, CA (US); Fan Zhou, San Jose, CA (US); Hao-Lin Chiu, Los Gatos, CA (US); Kyung Wook Kim, Saratoga, CA (US); Pengyu Sun, San Jose, CA (US); Shih Chang Chang, Cupertino, CA (US); Szu-Hsien Lee, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 766 days.

(21) Appl. No.: 17/841,354

(22) Filed: Jun. 15, 2022

Related U.S. Application Data

(60) Provisional application No. 63/227,890, filed on Jul. 30, 2021.

(51) Int. Cl.
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/131* (2023.02)

(58) Field of Classification Search
CPC ........... H10K 59/1213; H10K 59/1216; H10K 59/131
See application file for complete search history.

(56) References Cited

U.S. PATENT DOCUMENTS

| | | | |
|---|---|---|---|
| 9,727,165 B2 | 8/2017 | Kitsomboonloha et al. | |
| 9,734,783 B2 | 8/2017 | Yu et al. | |
| 9,842,551 B2 | 12/2017 | Yamashita et al. | |
| 10,037,738 B2 | 7/2018 | Kitsomboonloha et al. | |
| 10,078,405 B2 | 9/2018 | Jamshidi Roudbari et al. | |
| 10,373,562 B2 | 8/2019 | Zhang et al. | |
| 10,522,087 B2 | 12/2019 | Lin et al. | |
| 10,777,128 B2 | 9/2020 | Feng et al. | |
| 10,923,022 B2 | 2/2021 | Lin et al. | |
| 2018/0130418 A1 | 5/2018 | Zhu et al. | |
| 2019/0325822 A1* | 10/2019 | Li | G09G 3/3233 |
| 2021/0225251 A1 | 7/2021 | Xu et al. | |

FOREIGN PATENT DOCUMENTS

WO 2021007883 A1 1/2021

* cited by examiner

*Primary Examiner* — Elias Ullah
(74) *Attorney, Agent, or Firm* — Treyz Law Group; Jason Tsai

(57) ABSTRACT

A display may include an array of pixels that receive control signals from a chain of gate drivers. Each gate driver may include a number of semiconducting oxide transistors and capacitors. At least some of the semiconducting oxide transistors in the gate driver have bottom gate terminals configured to receive a separately adjustable bottom gate voltage for adjusting the threshold voltage during power on, normal, and power off operations. If desired, each gate driver may be provided with two or more different bottom gate voltages for individually controlling separate portions of the gate driver.

20 Claims, 10 Drawing Sheets

DISPLAY HAVING SEMICONDUCTING OXIDE GATE DRIVER CIRCUITRY WITH ADJUSTABLE THRESHOLD VOLTAGE

This application claims the benefit of U.S. Provisional Patent Application No. 63/227,890, filed Jul. 30, 2021, which is hereby incorporated by reference herein in its entirety.

BACKGROUND

This relates generally to electronic devices with displays and, more particularly, to display driver circuitry for displays such as organic light-emitting diode (OLED) displays.

Electronic devices often include displays. For example, cellular telephones, tablets, wrist-watches, and portable computers typically include displays for presenting image content to users. OLED displays have an array of display pixels based on light-emitting diodes. In this type of display, gate driver circuitry is used to provide control signals to respective rows in the array of display pixels. It can be challenging to design the gate driver circuitry.

SUMMARY

An electronic device may include a display having an array of display pixels. The display pixels may be organic light-emitting diode display pixels. Each display pixel may include at least an organic light-emitting diode (OLED) that emits light and associated semiconducting oxide transistors.

The array of display pixels may receive control signals such as gate output signals from peripheral gate driver circuitry. The gate driver circuitry may include gate driver circuits connected in a chain. Each gate driver circuit in the chain may include semiconducting oxide transistors and capacitors. Each of the semiconducting oxide transistors can have a drain terminal (sometimes referred to as a first source-drain terminal), a source terminal (sometimes referred to as a second source-drain terminal), a top gate terminal, and a bottom gate terminal.

In accordance with some embodiments, at least some of the bottom gate terminals of the semiconducting oxide transistors in a gate driver circuit are configured to receive an adjustable voltage. The adjustable voltage can be dynamically adjusted to control the threshold voltage of the associated semiconducting oxide transistors. Decreasing or deasserting the adjustable bottom gate voltage can force the transistor threshold voltage to a positive value (into an enhancement mode), which can be suitable for normal display operation. Increasing or asserting the adjustable bottom gate voltage can force the transistor threshold voltage to a negative value (into a depletion mode), which can be suitable for discharging internal nodes during a display power off sequence. The adjustable bottom gate voltage can also be tuned to compensate for transistor aging. Transistors that do not receive the adjustable voltage can have their bottom gate terminals shorted to their respective top gate terminals. Each gate driver circuit can be provided with more than one adjustable bottom gate voltage to provide enhanced flexibility.

DETAILED DESCRIPTION

Figure 1:
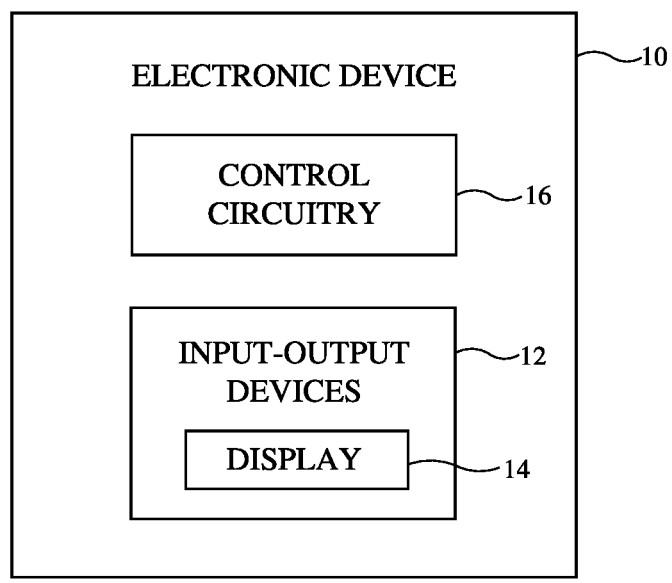
FIG. 1 is a diagram of an illustrative electronic device having a display in accordance with some embodiments.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, application processors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14. Device 10 may be a tablet computer, laptop computer, a desktop computer, a display, a cellular telephone, a media player, a wristwatch device or other wearable electronic equipment, or other suitable electronic device.

Display 14 may be an organic light-emitting diode display or may be a display based on other types of display technology. Configurations in which display 14 is an organic light-emitting diode (OLED) display are sometimes described herein as an example. This is, however, merely illustrative. Any suitable type of display may be used in device 10, if desired.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
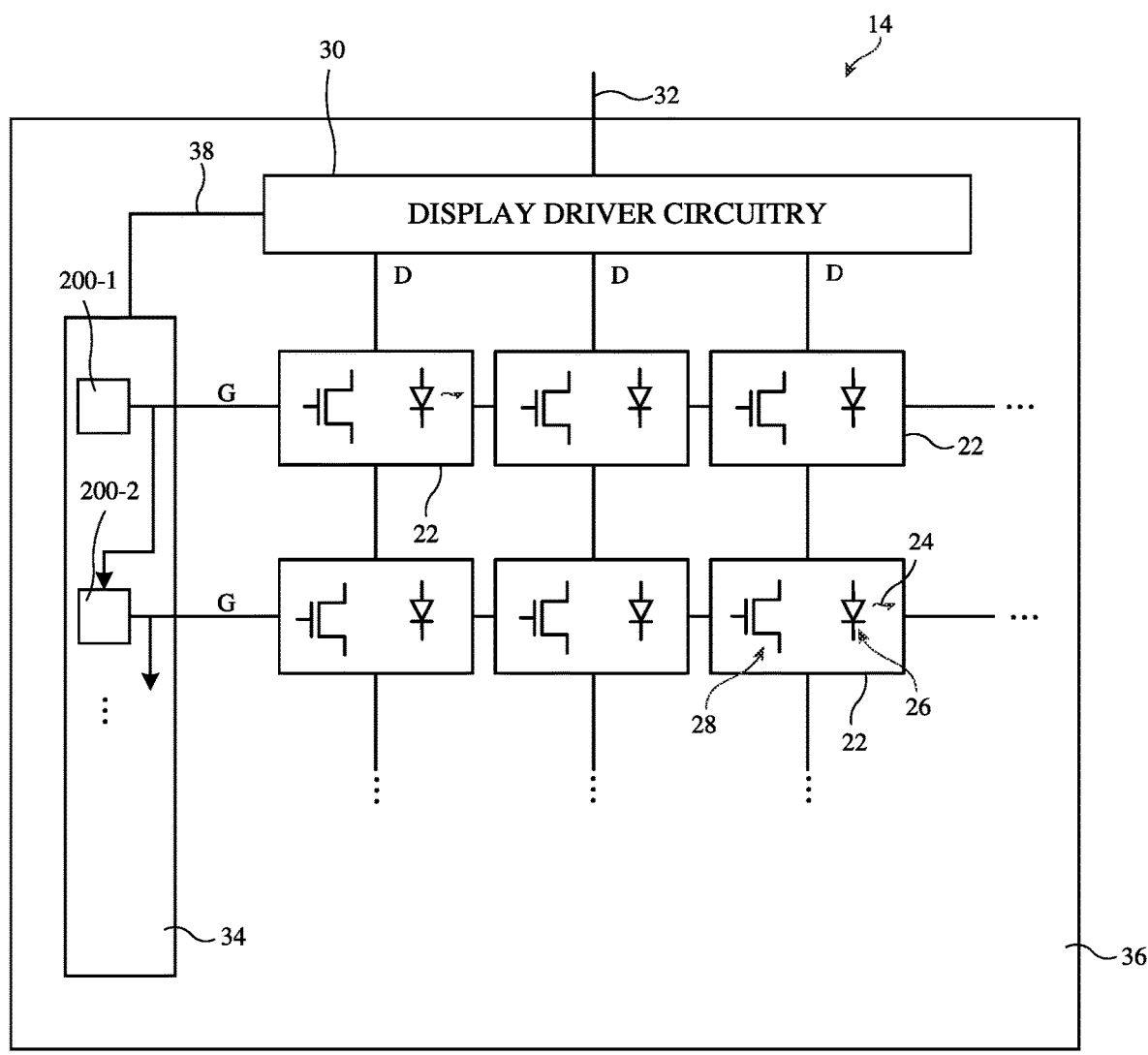
FIG. 2 is a diagram of an illustrative display having an array of organic light-emitting diode display pixels in accordance with some embodiments.

A top view of a portion of display 14 is shown in FIG. 2. As shown in FIG. 2, display 14 may have an array of pixels 22 formed on a substrate 36. Substrate 36 may be formed from glass, metal, plastic, ceramic, porcelain, or other substrate materials. Pixels 22 may receive data signals over signal paths such as data lines D (sometimes referred to as data signal lines, column lines, etc.) and may receive one or more control signals over control signal paths such as horizontal control lines G (sometimes referred to as gate lines, scan lines, emission lines, row lines, etc.). There may be any suitable number of rows and columns of pixels 22 in display 14 (e.g., tens or more, hundreds or more, or thousands or more).

Each pixel 22 may have a light-emitting diode 26 that emits light 24 under the control of a pixel control circuit formed from thin-film transistor circuitry such as thin-film transistors 28 and thin-film capacitors). Thin-film transistors 28 may be polysilicon thin-film transistors, semiconducting oxide thin-film transistors such as indium zinc gallium oxide transistors, or thin-film transistors formed from other semiconductors. Pixels 22 may contain light-emitting diodes of different colors (e.g., red, green, and blue) to provide display 14 with the ability to display color images.

Display driver circuitry 30 may be used to control the operation of pixels 22. The display driver circuitry 30 may be formed from integrated circuits, thin-film transistor circuits, or other suitable electronic circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D (e.g., data lines that run down the columns of pixels 22) while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14 (e.g., the gate driver circuitry may be formed on more than one side of the display pixel array).

Gate driver circuitry 34 (sometimes referred to as horizontal line control circuitry or row driver circuitry) may be implemented as part of an integrated circuit and/or may be implemented using thin-film transistor circuitry. Horizontal/row control lines G in display 14 may carry gate line signals (scan line control signals), emission enable control signals, and/or other horizontal control signals for controlling the pixels of each row. There may be any suitable number of horizontal control signals per row of pixels 22 (e.g., one or more row control lines, two or more row control lines, three or more row control lines, four or more row control lines, five or more row control lines, etc.). Gate driver circuitry 34 may include multiple gate driver circuits (e.g., gate drivers 200-1, 200-2, and so on) connected in a chain. For example, each gate driver may be configured to generate one or more scan signals and/or carry signals that are fed forward to a succeeding gate driver in the chain or that are fed back to a preceding gate driver in the chain.

In accordance with some embodiments, pixels 22 and gate driver circuitry 34 may be implemented using thin-film transistors such as semiconducting oxide transistors. Semiconducting oxide transistors are defined as thin-film transistors having a channel region formed from semiconducting oxide material (e.g., indium gallium zinc oxide or IGZO, indium tin zinc oxide or ITZO, indium gallium tin zinc oxide or IGTZO, indium tin oxide or ITO, or other semiconducting oxide material) and are generally considered n-type (n-channel) transistors.

A semiconducting oxide transistor is notably different than a silicon transistor (i.e., a transistor having a polysilicon channel region deposited using a low temperature process sometimes referred to as LTPS or low-temperature polysilicon). Semiconducting oxide transistors exhibit lower leakage than silicon transistors, so implementing at least some of the transistors within pixel 22 can help reduce flicker (e.g., by preventing current from leaking away from the gate terminal of a drive transistor within pixel 22). In accordance with some embodiments, pixels 22 and gate driver circuitry 34 may be formed using only semiconducting oxide transistors (i.e., display 14 does not include any silicon transistors).

In other suitable embodiments, at least some of the transistors within pixel 22 and/or gate driver circuitry 34 may be implemented as silicon transistors such that pixel 22 and/or gate driver circuitry 34 includes a combination of semiconducting oxide transistors and silicon transistors (e.g., n-type LTPS transistors or p-type LTPS transistors).

Different transistors within display 14 may require different device characteristics for optimal display performance and operation. For instance, transistors that are predominantly in the off state may require more negative-bias-temperature-stress (NBTS) stability. As another example, transistors that are predominantly in the on state may require more positive-bias-temperature-stress (PBTS) stability. At least some transistors within gate driver circuitry 34 may benefit from better PBTS and higher mobility for enhance drive-ability.

To satisfy these different requirements, display 14 may be formed using semiconducting oxide transistors with different device characteristics. To provide semiconducting oxide transistors with different device characteristics, multiple layers of semiconducting oxide material may be formed at different processing steps.

Figure 3:
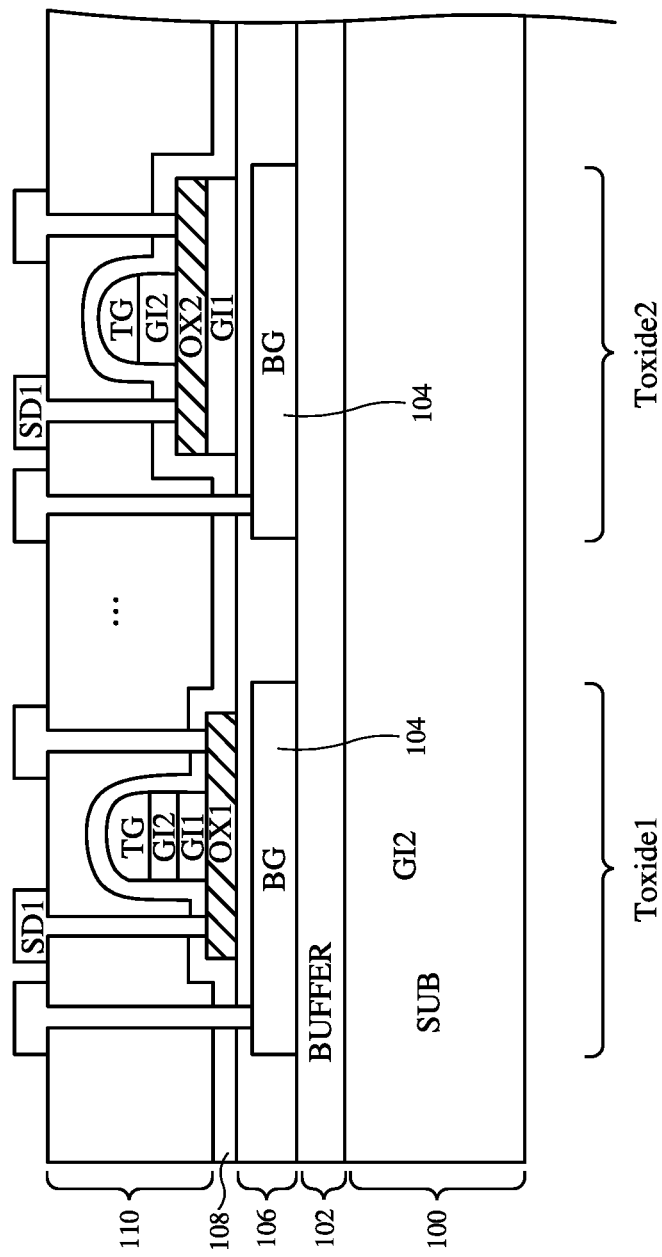
FIG. 3 is a cross-sectional side view of an illustrative display having semiconducting oxide transistors with top and bottom gate conductors in accordance with some embodiments.

FIG. 3 is a cross-sectional side view of display 14 having at least two different semiconducting oxide layers (e.g., semiconducting oxide layers formed at different processing steps using different materials or optionally using the same material). A "semiconducting oxide layer" is defined as an oxide layer that is formed from a semiconductor such as IGZO, IGTZO, ITO, ITZO, or other semiconductor material. As shown in FIG. 3, display 14 may have a display stackup that includes a substrate layer such as substrate 100. Substrate 100 may optionally be covered with one or more buffer layers 102. Buffer layer(s) 102 may include inorganic buffer layers such as layers of silicon oxide, silicon nitride, or other passivation or dielectric material.

A conductive layer such as metal layer 104 may be formed on buffer layer 102. Conductive layer 104 may be a blanket layer when initially deposited on layer 102. Conductive layer 104 may be patterned to form respective metal shielding or bottom gate conductors for respective semiconducting oxide transistors such as Toxide1 and Toxide2. Metal layer 104 may be formed using molybdenum, aluminum, nickel, chromium, copper, titanium, silver, gold, a combination of these materials, other metals, or other suitable conductive material. Metal layer 104 may serve as a bottom shielding layer (e.g., a shielding layer configured to block potentially interfering electromagnetic fields and/or light). Metal layer 104 may also serve as a bottom gate conductor for one or more semiconducting oxide transistors (e.g., semiconducting oxide transistors Toxide1 and Toxide2). A buffer insulating layer such as buffer insulating layer 106 may be formed over metal layer 104 and on buffer layer 102. Buffer insulating layer 106 (sometimes referred to as a second buffer layer) may be formed from silicon oxide, silicon nitride, or other passivation or insulating material.

A first oxide layer OX1 may be formed on insulating layer 106. Oxide layer OX1 is formed from semiconductor material. A first gate insulating layer GI1 may be formed over first oxide layer OX1. A second oxide layer OX2 may be formed on first gate insulating layer GI1. Oxide layer OX2 is also formed from semiconductor material. Second oxide layer OX2 may be formed over first oxide layer OX1. Semiconducting oxide layers OX1 and OX2 may be formed from the same or different semiconducting oxide materials. Oxide layers OX1 and OX2 may be blanket layers when first deposited. Oxide layer OX1 may be patterned to formed respective portions of first semiconducting oxide transistors (e.g., a portion of oxide layer OX1 is patterned to form the active region of transistor Toxide1). Oxide layer OX2 may be patterned to formed respective portions of second semiconducting oxide transistors (e.g., a portion of oxide layer OX2 is patterned to form the active region of transistor Toxide2).

A second gate insulating layer GI2 (which is formed separately from GI1) may be formed over second oxide layer OX2. Gate insulating layers GI1 and GI2 may be formed from silicon oxide, silicon nitride, silicon oxynitride, tantalum oxide, cerium oxide, carbon-doped oxide, aluminum oxide, hafnium oxide, titanium oxide, vanadium oxide, spin-on organic polymeric dielectrics, spin-on silicon based polymeric dielectric, a combination of these materials, and other suitable low-k or high-k solid insulating material. Gate insulating layers GI1 and GI2 may be blanket layers when first deposited. A first portion of layer GI1 may be patterned in between layer OX1 and the gate conductor of Toxide1, whereas a second portion of layer GI1 may be patterned under layer OX2 of Toxide2. A first portion of layer GI2 may be patterned in between layer OX1 and the top gate terminal of Toxide1, whereas a second portion of layer GI2 may be patterned in between layer OX2 and the gate conductor of Toxide2. A top gate conductive layer such as gate layer OG may be formed on second gate insulating layer GI2. Top gate conductor(s) OG may be formed from molybdenum, titanium, aluminum, nickel, chromium, copper, silver, gold, a combination of these materials, other metals, or other suitable gate conductor material. The top and bottom gate conductors of a semiconducting oxide transistor are sometimes referred to as upper and lower gate conductors (terminals).

In the example of FIG. 3, semiconducting oxide transistor Toxide1 includes channel and source-drain active regions formed using first semiconducting oxide layer OX1, whereas semiconducting oxide transistor Toxide2 includes channel and source-drain active regions formed using second semiconducting oxide layer OX2. Semiconducting oxide transistor Toxide1 has gate insulating layers GI1 and GI2 separating oxide layer OX1 from its gate conductor OG. Semiconducting oxide transistor Toxide2 has only gate insulating layer GI2 separating oxide layer OX2 from its gate conductor OG. Thus, the overall gate insulator of Toxide1 is thicker than the gate insulator of Toxide2. This difference in the overall thickness and composition of the gate insulating layer can be used to provide different device characteristics between transistor Toxide1 and Toxide2. Gate insulating layer GI1 may be formed using the same or different material as gate insulating layer GI2. In the scenario where conductors 104 also serve as bottom gate conductors, the bottom gate insulator thickness of transistor Toxide1 will be determined by the thickness of layer 106, whereas the bottom gate insulator thickness of transistor Toxide2 will be determined by the combined thickness of layers 106 and GI1. This difference in gate insulator thickness above and below the semiconducting oxide active region can be used to achieve different device characteristics.

In general, transistor Toxide1 and transistor Toxide2 may represent any semiconducting oxide transistor within display 14. As an example, transistor Toxide1 may be designed to provide improved reliability by using IGZO, whereas transistor Toxide2 may be designed to provide improved mobility by using IGZTO. The use of at least two different semiconducting oxide transistors is not limited to only the active display area but can also be extended to the gate driver circuits and other peripheral display control circuits. Using different types of semiconducting oxide transistors across different areas of display 14 can enable high performance while also reducing panel border.

Still referring to FIG. 3, a first interlayer dielectric (ILD1) layer 108 may be formed over the OG conductor. A second interlayer dielectric (ILD2) layer 110 may be formed on ILD1 layer 108. The ILD layers 108 and 110 may be formed from silicon oxide, silicon nitride, silicon oxynitride, tantalum oxide, cerium oxide, carbon-doped oxide, aluminum oxide, hafnium oxide, titanium oxide, vanadium oxide, spin-on organic polymeric dielectrics, spin-on silicon based polymeric dielectric, a combination of these materials, and other suitable low-k or high-k solid insulating material. Layers 108 and 110 may be formed from the same or different material.

A first source-drain metal routing layer SD1 may be formed on layer 110. The SD1 metal routing layer may be formed from aluminum, nickel, chromium, copper, molybdenum, titanium, silver, gold, a combination of these materials (e.g., a multilayer stackup of Ti/Al/Ti), other metals, or other suitable metal routing conductors. The SD1 metal routing layer may be patterned and/or etch to form SD1 metal routing paths.

As shown in FIG. 3, some of the SD1 metal routing paths may be coupled using vertical via(s) to one or more source-drain regions associated with transistor Toxide1 and to one or more source-drain regions associated with transistor Toxide2. Some of the SD1 metal routing paths may optionally be coupled to the bottom conductive layer 104 (see dotted structures in FIG. 3).

A planarization (PLN) layer such as layer 112 may be formed over the SD1 metal routing layer. Planarization layer 112 may be formed from organic dielectric materials such as polymer. An anode layer including an anode conductor 114 forming the anode terminal of the organic light-emitting diode 26 may be formed on planarization layer 112. Anode conductor 114 may be coupled to at least some of the SD1 metal routing paths using vertical via(s) 120 formed through planarization layer 112. Additional structures may be formed over the anode layer. For example, a pixel definition layer, a spacer structure, organic light-emitting diode emissive material, a cathode layer, and other pixel structures may also be included in the stackup of display pixel 22. However, these additional structures are omitted for the sake of clarity and brevity.

Conventional gate drivers typically include only semiconducting oxide transistors with top gate control (i.e., only the top gate conductor of any semiconducting oxide transistor in the display can be adjusted). It can be challenging to design gate driver circuits under such constraints.

Figure 4:
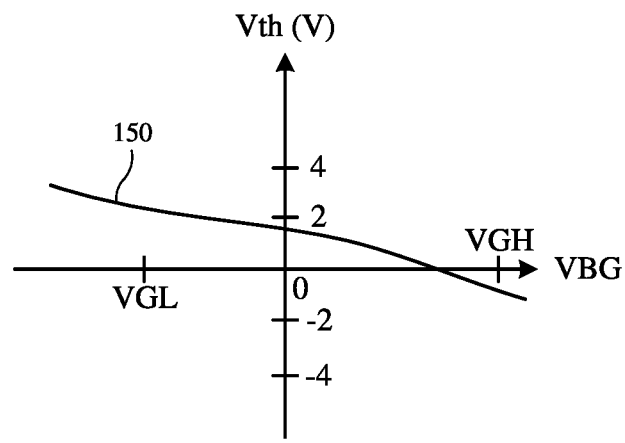
FIG. 4 is a plot showing how a semiconducting oxide transistor threshold voltage can vary as a function of bottom gate voltage in accordance with some embodiments.

In accordance with some embodiments, gate driver circuitry 34 may be provided with semiconducting oxide transistors at least some of which has separately controllable bottom gates for adjusting the threshold voltage of those transistors. FIG. 4 is a plot showing how semiconducting oxide transistor threshold voltage Vth can vary as a function of the bottom gate voltage VBG (e.g., an adjustable voltage that is applied to bottom gate conductor 104 in FIG. 3). Bottom gate voltage VBG is sometimes referred to as the back gate voltage. As shown by curve 150 in FIG. 4, threshold voltage Vth can have a positive value when VBG is equal to or less than ground power supply voltage VGL and can have a negative value when VBG is equal to a positive power supply voltage VGH. Ground power supply voltage VGL may be −2 V, −4, −6V, less than −8 V, −10V, −12V, 0V, or any suitable ground or negative power supply voltage level. Positive power supply voltage VGH may be 3 V, 4 V, 5 V, 6 V, 7 V, 2 to 8 V, 10V, 12V, 14V, 10-20 V, or any suitable positive power supply voltage level.

A lower VBG value corresponds to a positive Vth value for the top gate conductor. A semiconducting oxide transistor operating in such state is sometimes referred to as operating in an "enhance" or "enhancement" mode, which tends to provide operational stability and even lower leakage. In contrast, a higher VBG value corresponds to a negative Vth value with respect to the top gate conductor. A semiconducting oxide transistor operating in such state is sometimes referred to as operating in a "depletion" mode, which tends to provide higher drive current and may thus be suitable for discharging internal nodes within a gate driver circuit.

Figure 5:
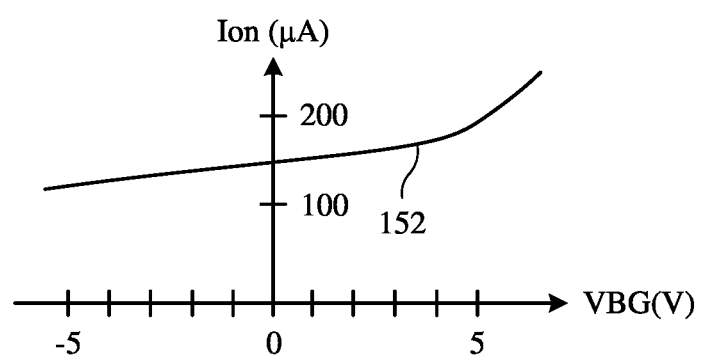
FIG. 5 is a plot showing how an on state current of a semiconducting oxide transistor can vary as a function of bottom gate voltage in accordance with some embodiments.

FIG. 5 is a plot showing how an on state current of a semiconducting oxide transistor can vary as a function of bottom gate voltage VBG. As shown by curve 152 in FIG. 5, a lower VBG value corresponds to a lower on current, whereas a higher VBG value corresponds to a higher on current. This result is consistent with FIG. 4 since a higher Vth value at lower VBG levels will reduce the on current while a lower Vth value at higher VBG levels will increase the on current.

Figure 6:
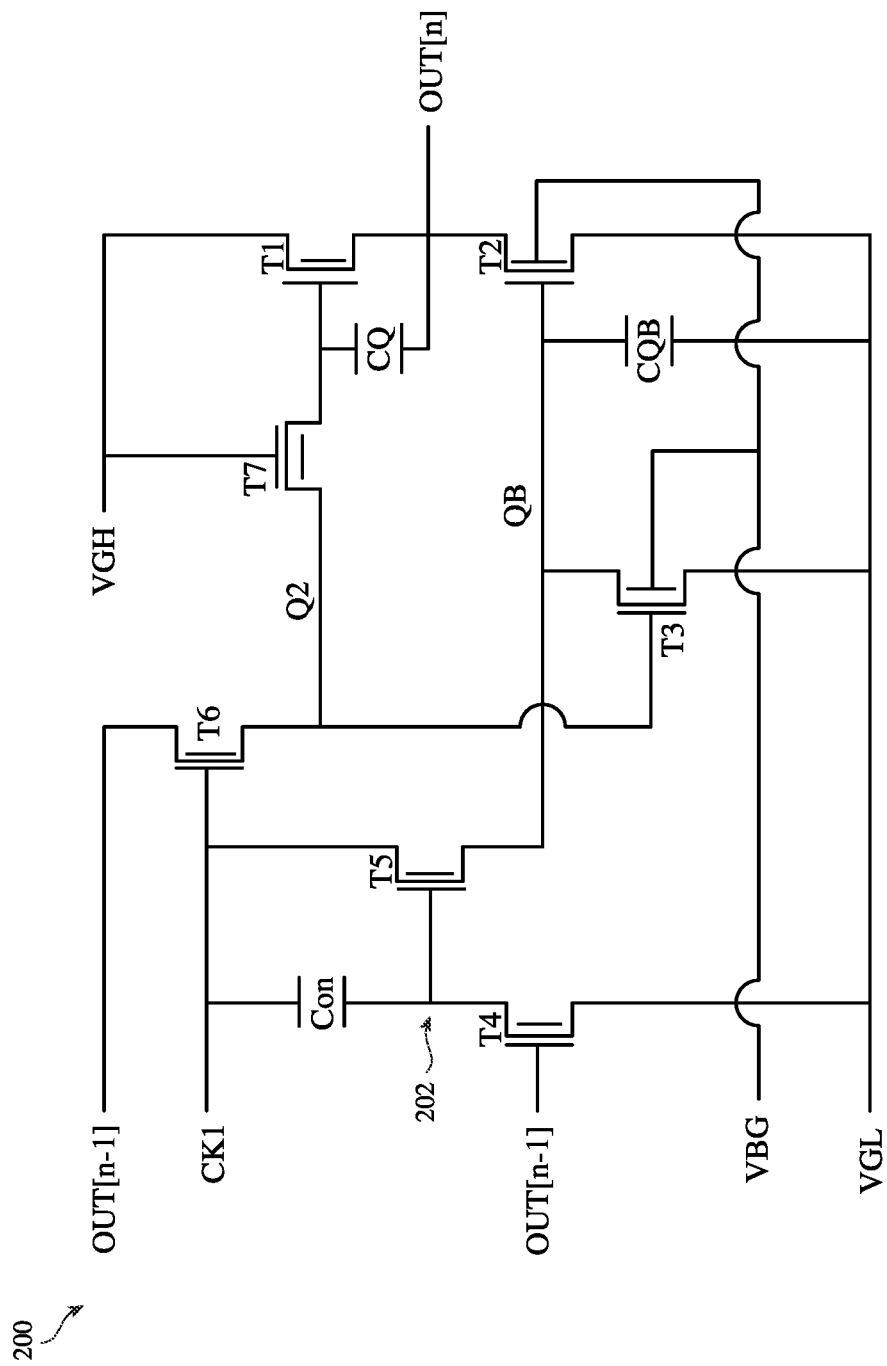
FIG. 6 is a circuit diagram of an illustrative gate driver circuit having semiconducting oxide transistors, two of which are provided with an adjustable bottom gate control voltage in accordance with some embodiments.

FIG. 6 is a circuit diagram of an illustrative gate driver circuit 200, a portion of which is provided with bottom gate control for Vth adjustability in accordance with some embodiments. As shown in FIG. 6, gate driver 200 may include semiconducting oxide transistors T1-T7 and capacitors CQ, CQB, and Con. Transistors T1 has a drain terminal coupled to a positive power supply terminal on which positive power supply voltage VGH is provided, a top gate terminal coupled to node Q, and a source terminal coupled to a gate driver output port on which gate output signal OUT [n] is generated. The notation "[n]" represents a signal for row n, whereas the notation "[n−1]" represents a signal for the row immediately preceding row n (i.e., the row above row n). The terms "source" and "drain" terminals that are used to describe current-conducting terminals of a transistor are sometimes interchangeable and may sometimes be referred to herein as "source-drain" terminals. Capacitor CQ may be coupled across the gate and source terminals of transistor T1.

Transistor T2 has a drain terminal coupled to the gate driver output port, a top gate terminal coupled to node QB, and a source terminal coupled to a ground line on which ground power supply voltage VGL is provided. Node QB generally exhibits a voltage that is opposite in polarity relative to the voltage at node Q (e.g., if node Q is high, then node QB is low, and vice versa). Capacitor QB may be coupled across the gate and source terminals of transistor T2. Transistors T1 and T2 directly coupled to the output port of circuit 200 are sometimes referred to collectively as an output buffer sub-circuit (or portion) of circuit 200. The remaining portion of gate driver 200, which includes transistors T3-T7, are sometimes referred to collectively as the logic sub-circuit (or portion) of gate driver 200.

Transistor T3 has a drain terminal coupled to node QB, a top gate terminal coupled to node Q2, and a source terminal coupled to ground voltage VGL. Transistor T4 has a drain terminal coupled to node 202, a top gate terminal configured to receive signal OUT [n−1] (e.g., the gate driver output signal from the preceding row in the chain of gate drivers), and source terminal coupled to ground voltage VGL. Transistor T5 has a source terminal coupled to node QB, a top gate terminal coupled to node 202, and a drain terminal configured to receive a clock signal CK1. Clock signal CK1 may be a clock signal that is fed to the gate drivers in the odd rows (as an example). There can be another clock signal CK2 that is fed to the gate drivers in the even rows. Clock signal CK2 can be a delayed version of clock signal CK1. Transistor T6 may have a drain terminal configured to receive signal OUT [n−1], a top gate terminal configured to receive clock signal CK1, and a source terminal coupled to node Q2. Transistor T7 may have a first source-drain terminal coupled to node Q, a second source-drain terminal coupled to node Q2, and a top gate terminal configured to receive positive power supply voltage VGH. Transistor T7 connected in this way is sometimes referred to as a pass transistor.

In the example of FIG. 6, transistors T2 and T3 have bottom (back) gate terminals configured to receive adjustable voltage VBG. Top and bottom gate terminals are sometimes referred to as upper and lower gate terminals (conductors). Voltage VBG can be adjusted depending on the operating mode of gate driver 200 to control the threshold voltage of transistors T2 and T3 to appropriate levels, as described below in connection with FIG. 7. In other words, transistors T2 and T3 have bottom gate conductors coupled to a separate control line on which voltage VBG is applied. The remaining transistors T1 and T4-T7 in gate driver 200 have bottom gate conductors shorted to their respective top gate conductors, effectively acting like three-terminal devices since their top and bottom gate voltages will move in tandem. Configured in this way, transistors T2 and T3 can be used to discharge one or more internal nodes within gate driver 200 without having to add additional dedicated discharging transistors, thereby reducing circuit area and power consumption.

Figure 7:
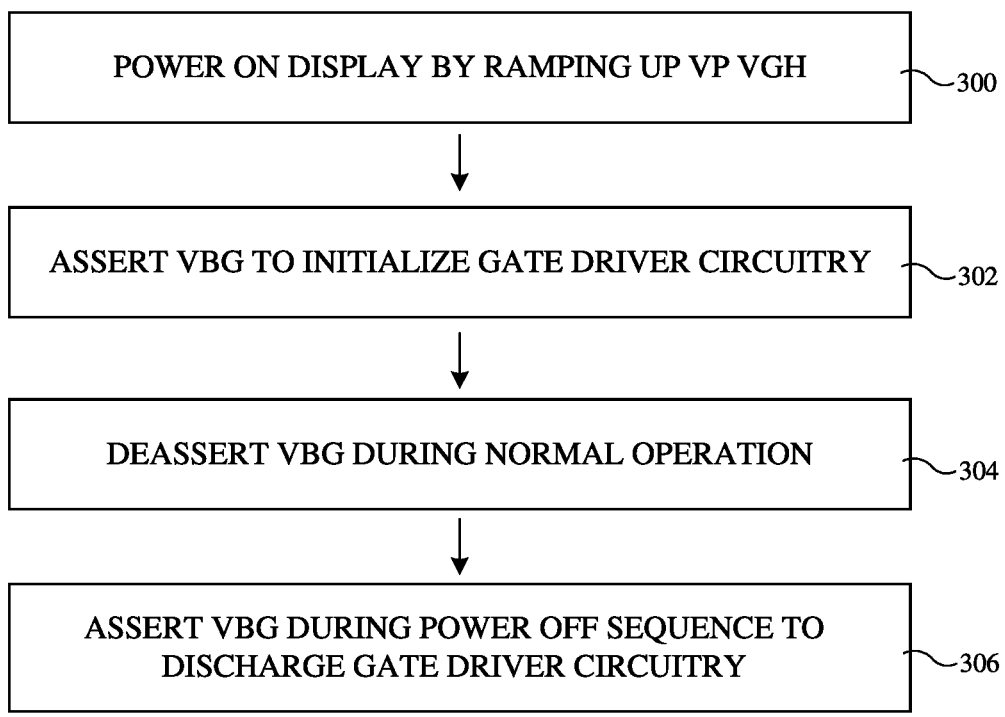
FIG. 7 is a flow chart of illustrative steps for operating gate driver circuitry in accordance with some embodiments.

FIG. 7 is a flow chart of illustrative steps for operating gate driver circuitry 34. At step 300, the display may be powered on by ramping up power supply voltage VGH from a low voltage level (e.g., −6V, −8V, −10V, etc.) to a high voltage level (e.g., 10V, 12V, 14V, 16V, etc.). At step 302, the bottom gate voltage VBG may be asserted (e.g., driven from the low voltage level to the high voltage level) to initialize the corresponding semiconducting oxide transistors within gate driver circuitry 34. After initialization, the display can then be placed in normal operation.

During normal display operation of block 304, bottom gate voltage VBG may be deasserted (e.g., voltage VBG may be biased to the low voltage level). Configured in this way, the corresponding transistors within gate driver 200 that are coupled to VBG are operated in the enhancement mode and exhibits a positive threshold voltage.

During a power off sequence of block 306, bottom gate voltage VBG may be asserted (e.g., voltage VBG may be driven high from the low voltage level to the high voltage level). Configured in this way, the corresponding transistors within gate driver 200 that are coupled to VBG are operated in the depletion mode and exhibits a negative threshold voltage. Providing a negative threshold voltage during the power off sequence enhances the on current of the corresponding transistors, which can help better discharge the voltage on the storage capacitors (e.g., transistor T2 can help discharge the voltage on capacitor CQ at a faster rate, whereas transistor T3 can help discharge the voltage on capacitor CQB at a faster rate).

The operations of FIG. 7 are merely illustrative. At least some of the described operations may be modified or omitted; some of the described operations may be performed in parallel; additional processes may be added or inserted between the described operations; the order of certain operations may be reversed or altered; the timing of the described operations may be adjusted so that they occur at slightly different times, or the described operations may be distributed in a system.

Figure 8:
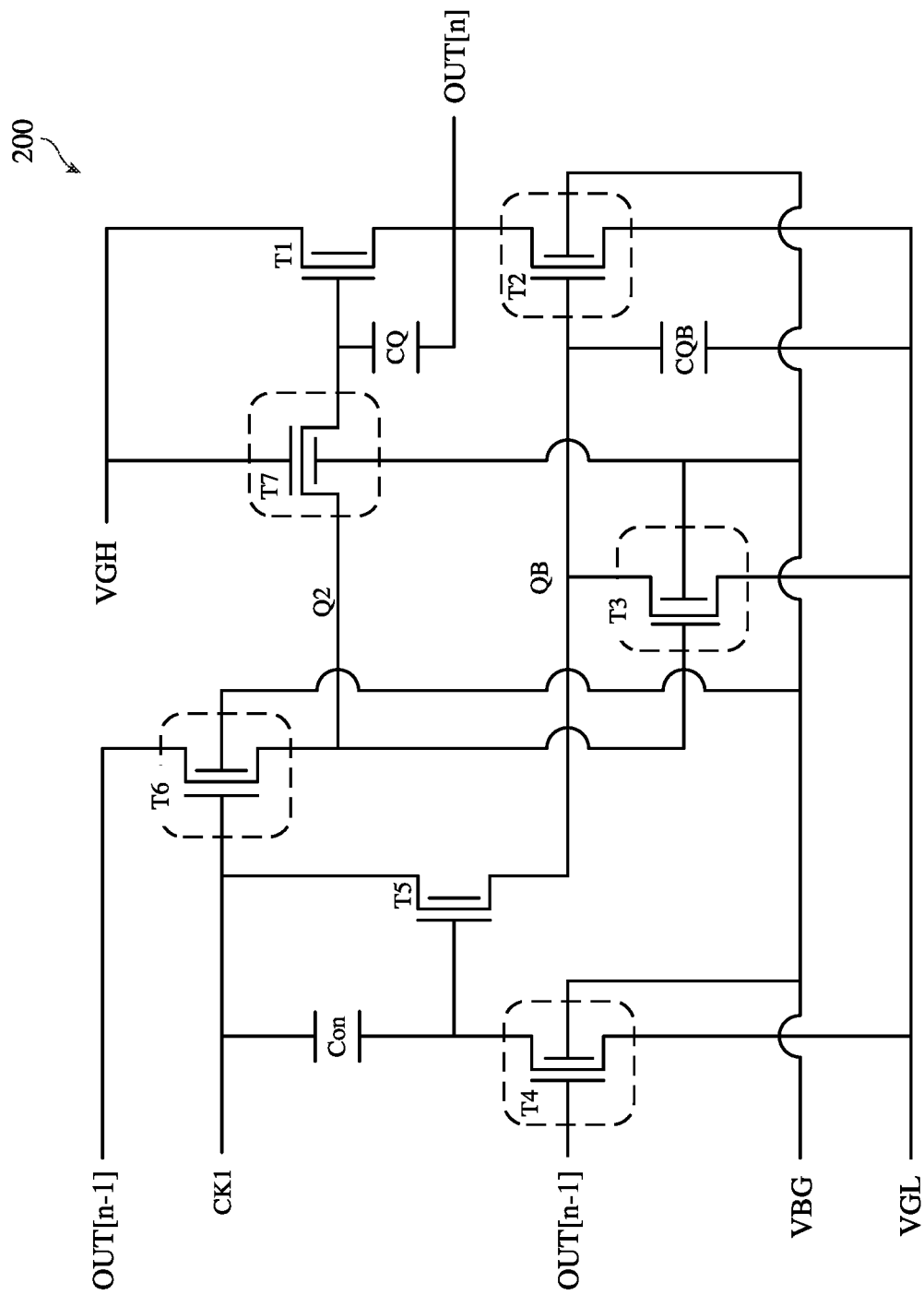
FIG. 8 is a circuit diagram of an illustrative gate driver circuit having semiconducting oxide transistors, more than two of which are provided with an adjustable bottom gate control voltage in accordance with some embodiments.

The example of FIG. 6 in which only transistors T2 and T3 have separately adjustable bottom gate conductors is merely illustrative. FIG. 8 shows another suitable embodiment in which more than two transistors within gate driver 200 are coupled to bottom gate voltage VBG. As shown in FIG. 8, transistors T2, T3, T4, T6, and T7 all have bottom gate terminals coupled to voltage VBG while transistors T1 and T5 each have top and bottom gate terminals shorted. This can further enhance the discharging capabilities of gate driver 200 during the power off sequence. If desired, all of the transistors within gate driver can have their bottom gate terminals coupled to VBG (e.g., transistors T1-T7 can have back gate conductors all configured to receive adjustable voltage VBG). The operations of FIG. 7 can also be used to operate gate driver 200 of FIG. 8.

Figure 9:
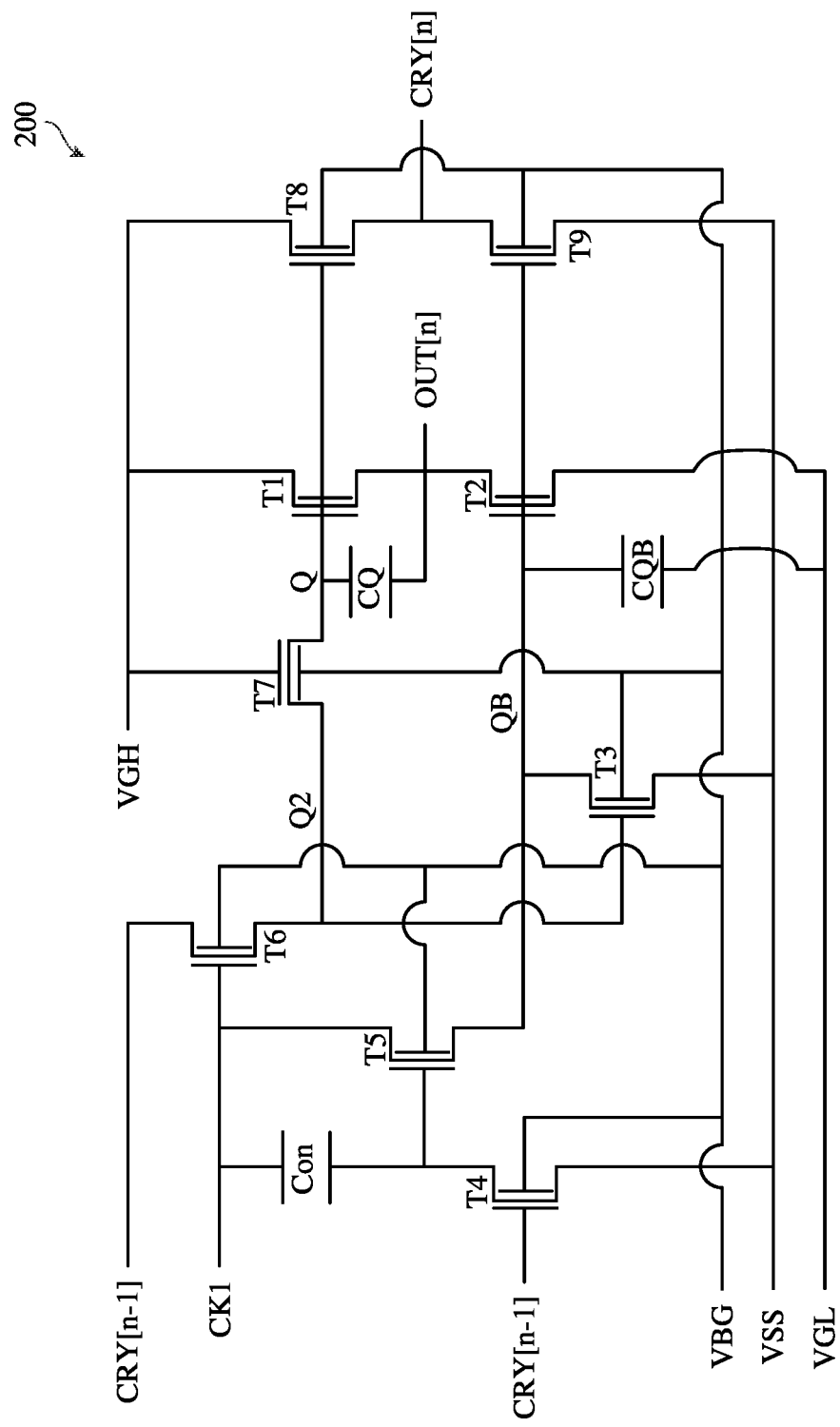
FIG. 9 is a circuit diagram of an illustrative gate driver circuit having semiconducting oxide transistors, where all transistors other than the transistors in the output buffer sub-circuit are provided with an adjustable bottom gate control voltage in accordance with some embodiments.

The examples of FIGS. 6 and 8 in which gate driver circuit 200 has one ground power supply line is merely illustrative. FIG. 9 shows another suitable embodiment where gate driver 200 has two ground power supply lines. As shown in FIG. 9, transistor T2 has a source terminal coupled to a first ground power supply line on which first ground power supply voltage VGL is provided, whereas transistors T3, T4, and T9 now have source terminals coupled to a second ground power supply line on which second ground power supply voltage VSS is provided. In general, voltage VSS may be less than voltage VGL (e.g., voltage VSS may be at least 1 V, 2 V, 3 V, or 4 V less than VGL). This is merely illustrative. If desired, voltage VSS may be equal to or greater than voltage VGL. Use of the two different ground voltages VGL and VSS can help provide a higher on current through the output buffer sub-circuit.

FIG. 9 also includes two additional semiconducting oxide transistors T8 and T9. Transistor T8 has a drain terminal coupled to power supply voltage VGH, a top gate terminal coupled to node Q, and a source terminal coupled to a carry output port on which a carry signal CRY [n] is generated. Transistor T9 has a drain terminal coupled to the carry output port, a top gate terminal coupled to node QB, and a source terminal coupled to second ground voltage VSS. In the example of FIG. 9, the drain terminal of T6 and the top gate terminal of T4 are configured to receive carry signal CRY [n−1] (e.g., the carry output signal from the previous row). In FIG. 9, all of the transistors within driver 200 except for the output buffer transistors T1 and T2 have their bottom gate terminals configured to receive adjustable voltage VBG. Transistors T1 and T2 can each have their top and bottom gate conductors connected together. This is merely illustrative. If desired, the bottom gate terminals of transistors T1 and T2 can instead be configured to receive adjustable voltage VBG. The operations of FIG. 7 can also be used to operate gate driver 200 of FIG. 9.

Figure 10:
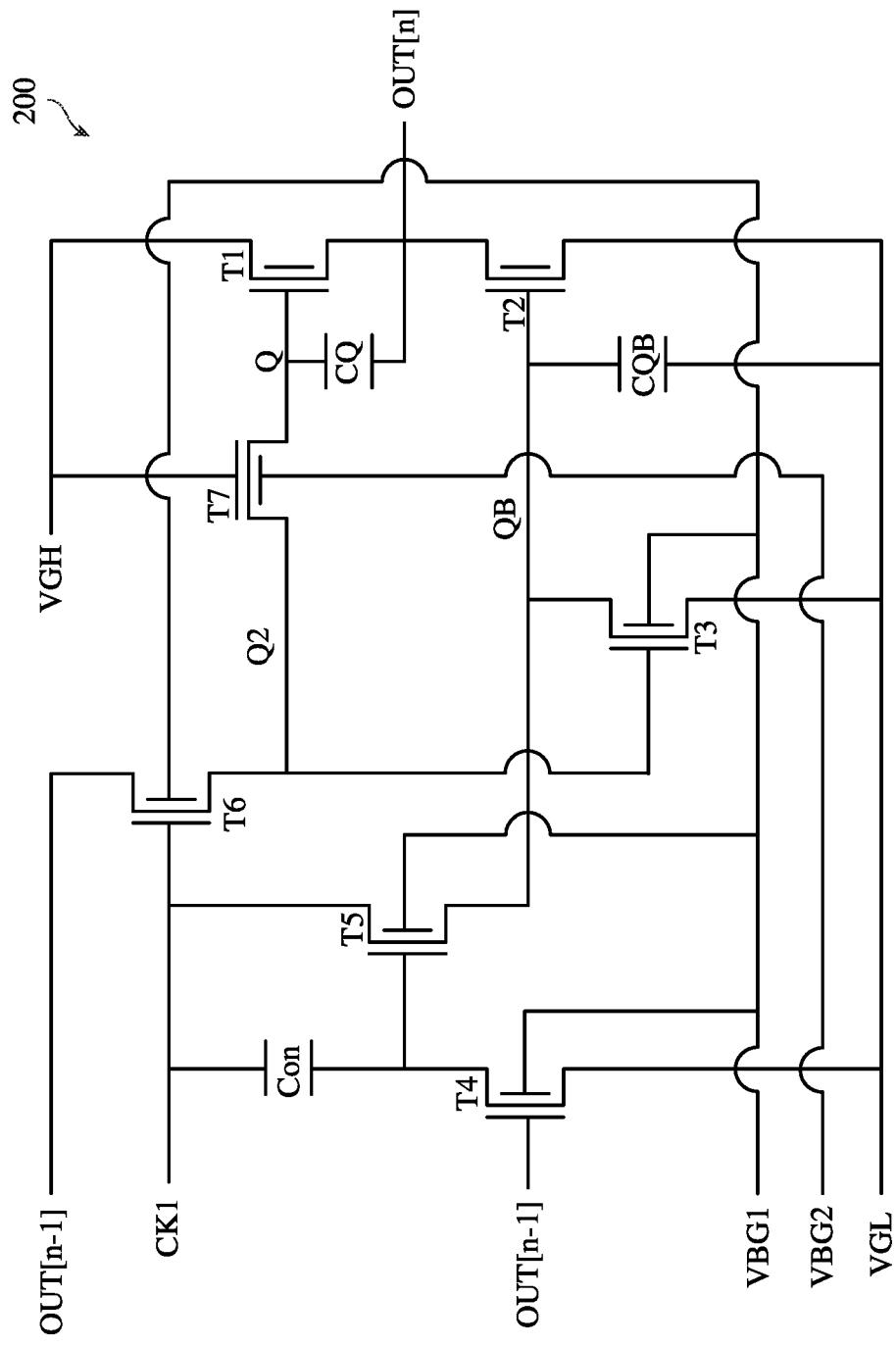
FIG. 10 is a circuit diagram of an illustrative gate driver circuit having semiconducting oxide transistors, a subset of which are provided with two separate adjustable bottom gate control voltages in accordance with some embodiments.

The example of FIG. 8 in which gate driver circuit 200 has one adjustable bottom gate voltage is merely illustrative. FIG. 10 illustrates another suitable embodiment where gate driver 200 includes at least two separately adjustable bottom gate voltages VBG1 and VBG2. As shown in FIG. 10, transistors T1-T6 have bottom gate terminals configured to receive voltage VBG1, whereas transistor T7 has its bottom gate terminal configured to receive voltage VBG2. Voltage VBG2 may be lower than VBG1 to accommodate potential differences in the transistor threshold voltage levels. Configured in this way, the threshold voltage of pass transistor T7 can be controlled separately from the remaining transistors in gate driver circuit 200, providing enhanced flexibility. The operations of FIG. 7 can also be used to operate gate driver 200 of FIG. 10.

Figure 11:
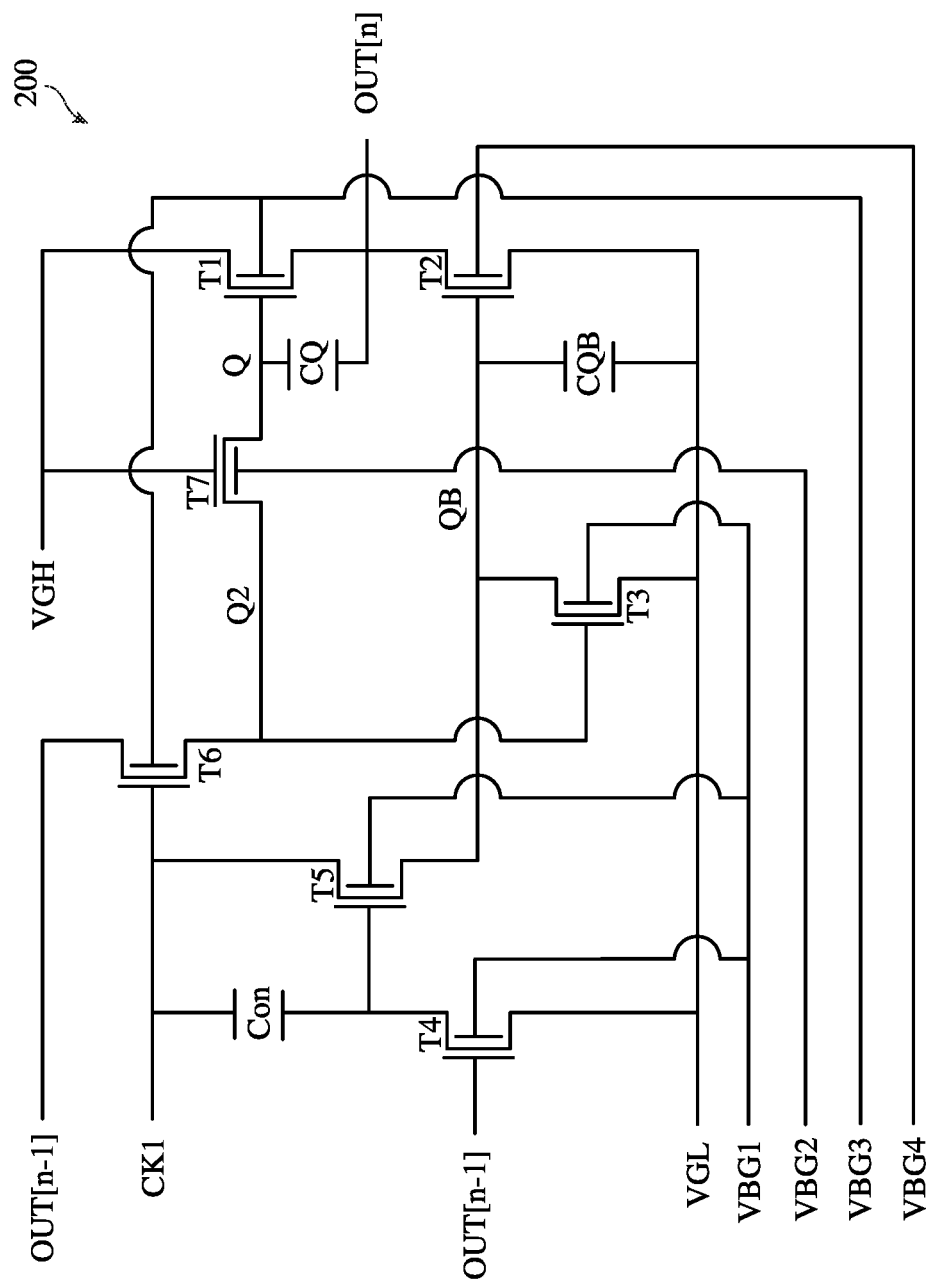
FIG. 11 is a circuit diagram of an illustrative gate driver circuit having semiconducting oxide transistors, a subset of which are provided with four separate adjustable bottom gate control voltages in accordance with some embodiments.

FIG. 11 illustrates yet another suitable embodiment of gate driver circuit 200 having at least four different bottom gate voltages VBG1, VBG2, VBG3, and VBG4. As shown in FIG. 11, transistors T3, T4, and T5 have bottom gate terminals configured to receive voltage VBG1; pass transistor T7 has its bottom gate terminal configured to receive voltage VBG2; transistors T1 and T6 have their bottom gate terminals configured to receive voltage VBG3; and transistor T2 has its bottom gate terminal configured to receive voltage VBG4. Having more individually adjustable back gate voltages can provide even more flexibility. The operations of FIG. 7 can also be used to operate gate driver 200 of FIG. 11.

In general, gate driver circuit 200 can be provided with any suitable number of adjustable bottom gate voltages, each of which is used to control a corresponding portion of gate driver 200. For example, gate driver circuit 200 may be provided with at least one bottom gate voltage (as shown in the examples of FIGS. 6, 8, and 9), at least two different bottom gate voltages (as shown in the example of FIG. 10), at least three different bottom gate voltages, at least four different bottom gate voltages (as shown in the example of FIG. 11), more than four different bottom gate voltages, etc. Each of the different bottom gate voltages can be used to adjust the threshold voltage of one or more semiconducting oxide transistors in gate driver 200. If desired, one or more semiconducting oxide transistors in gate driver 200 need not receive a separately adjustable bottom gate voltage and can have its bottom gate terminal shorted to its top gate terminal.

The foregoing is merely illustrative and various modifications can be made to the described embodiments. The foregoing embodiments may be implemented individually or in any combination.

What is claimed is:

1. A display comprising:
  an array of pixels; and
  a chain of gate driver circuits configured to provide gate output signals to the array of pixels, wherein each gate driver circuit in the chain of gate driver circuits comprises:
    a first transistor having a drain terminal coupled to a positive power supply line, a source terminal coupled to a gate driver output port on which one of the gate output signals is generated, a top gate terminal, and a bottom gate terminal;
    a second transistor having a drain terminal coupled to the gate driver output port, a source terminal coupled to a ground power supply line, a top gate terminal, and a bottom gate terminal configured to receive an adjustable voltage; and
    a third transistor having a drain terminal coupled to the top gate terminal of the second transistor, a source terminal coupled to the ground power supply line, a top gate terminal, and a bottom gate terminal configured to receive the adjustable voltage.

2. The display of claim 1, wherein all transistors within the chain of gate driver circuits comprise semiconducting oxide transistors each having a channel formed from semiconducting oxide.

3. The display of claim 1, wherein each gate driver circuit in the chain of gate driver circuits further comprises:
  a first storage capacitor having a first terminal coupled to the top gate terminal of the first transistor and having a second terminal coupled to the source terminal of the first transistor; and
  a second storage capacitor having a first terminal coupled to the top gate terminal of the second transistor and having a second terminal coupled to the source terminal of the second transistor.

4. The display of claim 1, wherein the top and bottom gate terminals of the first transistor are shorted together.

5. The display of claim 1, wherein the bottom gate terminal of the first transistor is configured to receive the adjustable voltage.

6. The display of claim 1, wherein each gate driver circuit in the chain of gate driver circuits further comprises:
  an additional transistor having a first source-drain terminal coupled to the top gate terminal of the first transistor, a second source-drain terminal coupled to the top gate terminal of the third transistor, and a top gate terminal coupled to the positive power supply line.

7. The display of claim 6, wherein the additional transistor further comprises a bottom gate terminal coupled to its top gate terminal.

8. The display of claim 6, wherein the additional transistor further comprises a bottom gate terminal configured to receive the adjustable voltage.

9. The display of claim 6, wherein the additional transistor further comprises a bottom gate terminal configured to receive an additional adjustable voltage separate from the adjustable voltage.

10. The display of claim 1, wherein each gate driver circuit in the chain of gate driver circuits further comprises:
  a fourth transistor having a source terminal coupled to the ground power supply line, a top gate terminal configured to receive one of the gate output signals from a preceding gate driver circuit in the chain, a bottom gate terminal shorted to its top gate terminal, and a drain terminal;
  a fifth transistor having a source terminal coupled to the top gate terminal of the second transistor, a top gate terminal coupled to the drain terminal of the fourth transistor, a bottom gate terminal shorted to its top gate terminal, and a drain terminal configured to receive a clock signal;
  a sixth transistor having a source terminal coupled to the top gate terminal of the third transistor, a top gate terminal configured to receive the clock signal, a bottom gate terminal shorted to its top gate terminal, and a drain terminal configured to receive one of the gate output signals from the preceding gate driver circuit in the chain; and
  a seventh transistor having a first source-drain terminal coupled to the top gate terminal of the first transistor, a second source-drain terminal coupled to the top gate terminal of the third transistor, a top gate terminal coupled to the positive power supply line, and a bottom gate terminal shorted to its top gate terminal.

11. The display of claim 1, wherein each gate driver circuit in the chain of gate driver circuits further comprises:
  a fourth transistor having a source terminal coupled to the ground power supply line, a top gate terminal configured to receive one of the gate output signals from a preceding gate driver circuit in the chain, a bottom gate terminal configured to receive the adjustable voltage, and a drain terminal;
  a fifth transistor having a source terminal coupled to the top gate terminal of the second transistor, a top gate terminal coupled to the drain terminal of the fourth transistor, a bottom gate terminal shorted to its top gate terminal, and a drain terminal configured to receive a clock signal;
  a sixth transistor having a source terminal coupled to the top gate terminal of the third transistor, a top gate terminal configured to receive the clock signal, a bottom gate terminal configured to receive the adjustable voltage, and a drain terminal configured to receive one of the gate output signals from the preceding gate driver circuit in the chain; and
  a seventh transistor having a first source-drain terminal coupled to the top gate terminal of the first transistor, a second source-drain terminal coupled to the top gate terminal of the third transistor, a top gate terminal coupled to the positive power supply line, and a bottom gate terminal configured to receive the adjustable voltage.

12. The display of claim 1, wherein each gate driver circuit in the chain of gate driver circuits further comprises:
- a fourth transistor having a source terminal coupled to the ground power supply line, a top gate terminal configured to receive one of the gate output signals from a preceding gate driver circuit in the chain, a bottom gate terminal configured to receive the adjustable voltage, and a drain terminal;
- a fifth transistor having a source terminal coupled to the top gate terminal of the second transistor, a top gate terminal coupled to the drain terminal of the fourth transistor, a bottom gate terminal configured to receive the adjustable voltage, and a drain terminal configured to receive a clock signal;
- a sixth transistor having a source terminal coupled to the top gate terminal of the third transistor, a top gate terminal configured to receive the clock signal, a bottom gate terminal configured to receive the adjustable voltage, and a drain terminal configured to receive one of the gate output signals from the preceding gate driver circuit in the chain; and
- a seventh transistor having a first source-drain terminal coupled to the top gate terminal of the first transistor, a second source-drain terminal coupled to the top gate terminal of the third transistor, a top gate terminal coupled to the positive power supply line, and a bottom gate terminal configured to receive the adjustable voltage.

13. The display of claim 1, wherein each gate driver circuit in the chain of gate driver circuits further comprises:
- a fourth transistor having a source terminal coupled to the ground power supply line, a top gate terminal configured to receive one of the gate output signals from a preceding gate driver circuit in the chain, a bottom gate terminal configured to receive the adjustable voltage, and a drain terminal;
- a fifth transistor having a source terminal coupled to the top gate terminal of the second transistor, a top gate terminal coupled to the drain terminal of the fourth transistor, a bottom gate terminal configured to receive the adjustable voltage, and a drain terminal configured to receive a clock signal;
- a sixth transistor having a source terminal coupled to the top gate terminal of the third transistor, a top gate terminal configured to receive the clock signal, a bottom gate terminal configured to receive the adjustable voltage, and a drain terminal configured to receive one of the gate output signals from the preceding gate driver circuit in the chain; and
- a seventh transistor having a first source-drain terminal coupled to the top gate terminal of the first transistor, a second source-drain terminal coupled to the top gate terminal of the third transistor, a top gate terminal coupled to the positive power supply line, and a bottom gate terminal configured to receive an additional adjustable voltage separate from the adjustable voltage.

14. A display comprising:
an array of pixels; and
a plurality of gate driver circuits configured to provide gate output signals to the array of pixels, wherein each gate driver circuit in the plurality of gate driver circuits comprises:
- an output port;
- a first transistor having a drain terminal coupled to a positive power supply line, a source terminal coupled to the output port, a top gate terminal, and a bottom gate terminal;
- a second transistor having a drain terminal coupled to the output port, a source terminal coupled to a ground power supply line, a top gate terminal, and a bottom gate terminal; and
- additional transistors coupled to the first and second transistors, wherein at least one of the additional transistors has a bottom gate terminal configured to receive an adjustable voltage.

15. The display of claim 14, wherein the bottom gate terminal of the second transistor is configured to receive the adjustable voltage.

16. The display of claim 15, wherein the bottom gate terminal of the first transistor is configured to receive the adjustable voltage.

17. The display of claim 14, wherein at least one of the transistors in the gate driver circuit has a bottom gate terminal configured to receive an additional adjustable voltage separate from the adjustable voltage.

18. The display of claim 14, wherein:
the bottom gate terminal of the first transistor is configured to receive a first additional adjustable voltage separate from the adjustable voltage; and
the bottom gate terminal of the second transistor is configured to receive a second additional adjustable voltage separate from the adjustable voltage.

19. A display comprising:
an array of pixels; and
a chain of gate driver circuits configured to generate gate output signals to the array of pixels and carry signals, wherein each gate driver circuit in the chain of gate driver circuits comprises:
- a first transistor having a drain terminal coupled to a positive power supply line, a source terminal coupled to a gate driver output port on which one of the gate output signals is generated, and a top gate terminal;
- a second transistor having a drain terminal coupled to the gate driver output port, a source terminal coupled to a first ground power supply line, and a top gate terminal;
- a third transistor having a drain terminal coupled to the top gate terminal of the second transistor, a source terminal coupled to a second ground power supply line separate from the first ground power supply line, a top gate terminal, and a bottom gate terminal configured to receive an adjustable voltage;
- a fourth transistor having a source terminal coupled to the second ground power supply line, a top gate terminal configured to receive one of the carry signals from a preceding gate driver circuit in the chain, a bottom gate terminal configured to receive the adjustable voltage, and a drain terminal;
- a fifth transistor having a source terminal coupled to the top gate terminal of the second transistor, a top gate terminal coupled to the drain terminal of the fourth transistor, a bottom gate terminal configured to receive the adjustable voltage, and a drain terminal configured to receive a clock signal;
- a sixth transistor having a source terminal coupled to the top gate terminal of the third transistor, a top gate terminal configured to receive the clock signal, a bottom gate terminal configured to receive the adjustable voltage, and a drain terminal configured to receive one of the carry signals from the preceding gate driver circuit in the chain; and
- a seventh transistor having a first source-drain terminal coupled to the top gate terminal of the first transistor, a second source-drain terminal coupled to the top gate terminal of the third transistor, a top gate terminal coupled to the positive power supply line, and a bottom gate terminal configured to receive the adjustable voltage.

20. The display of claim 19, wherein each gate driver circuit in the chain of gate driver circuits further comprises:
a carry output port on which one of the carry signals is generated;
an eighth transistor having a drain terminal coupled to the positive power supply line, a source terminal coupled to the carry output port, a top gate terminal coupled to the top gate terminal of the first transistor, and a bottom gate terminal configured to receive the adjustable voltage; and
a ninth transistor having a drain terminal coupled to the carry output port, a source terminal coupled to the second ground power supply line, a top gate terminal coupled to the top gate terminal of the second transistor, and a bottom gate terminal configured to receive the adjustable voltage.

\* \* \* \* \*